United States Patent [19]

Maier et al.

[11] Patent Number: 4,604,571
[45] Date of Patent: Aug. 5, 1986

[54] CIRCUIT FOR THE DETERMINATION OF VOLTAGE EXTREMA

[75] Inventors: Gerhard Maier, Dauchingen; Joachim Lange, Villingen-Schwenningen, both of Fed. Rep. of Germany

[73] Assignee: Deutsche Thomson-Brandt GmbH, Villingen-Schwenningen, Fed. Rep. of Germany

[21] Appl. No.: 583,173

[22] Filed: Feb. 24, 1984

[30] Foreign Application Priority Data

Feb. 24, 1983 [DE] Fed. Rep. of Germany ....... 3306401

[51] Int. Cl.⁴ .............................................. G01R 23/16
[52] U.S. Cl. .................................. 324/77 A; 324/77 B
[58] Field of Search ................. 324/77 R, 77 A, 77 B, 324/57 PS, 57 SS, 57 Q, 73 R, 73 AT; 364/484, 485

[56] References Cited

U.S. PATENT DOCUMENTS 3,427,536  2/1969  Wainwright ..................... 324/77 B
3,973,112  8/1976  Sloane ............................. 324/77 B
4,438,504  3/1984  Favin ................................ 364/484

*Primary Examiner*—Michael J. Tokar
*Attorney, Agent, or Firm*—Horst M. Kasper

[57] ABSTRACT

A circuit is provided for the measurement and recognition of maximum or minimum voltages coming for example from a frequency selective measurement objective and in particular from an electronic filter. A fixed measurement frequency is fed to the measurement object. The measurement object is balanced by a stepwise change of a tuning voltage. The output voltage generated by the measurement object is fed to a switch after rectification and amplification, which switch is clocked with a clock signal. The output voltages of the switch are fed to an intermediate storage. The output voltages of the intermediate storage are supplied to a differential amplifier via an intermediate switch actuated by a control clock cycle. If the output voltage reaches an extremum such as a maximum then the stepwise change of the tuning voltage is interrupted. The value determined for the tuning voltage is stored in a memory such as a random access memory, the contents of which represents the optimum for the tuning of the measurement object such as for example the filter.

15 Claims, 1 Drawing Figure

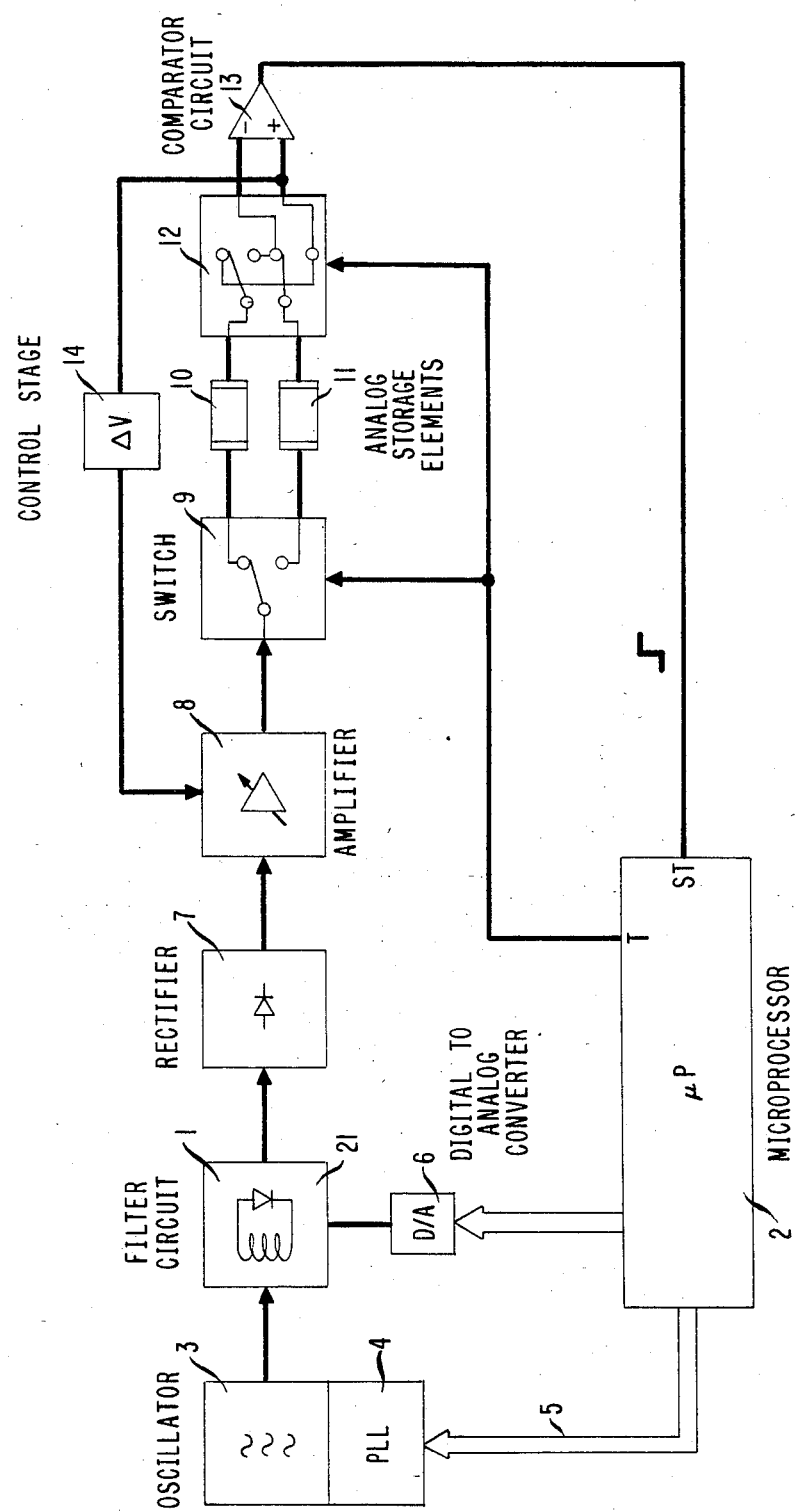

CIRCUIT FOR THE DETERMINATION OF VOLTAGE EXTREMA

BACKGROUND OF THE INVENTION

1. Field of the Invention

The invention relates to a circuit for the measurement and recognition of an extremum output voltage of a frequency selective electronic measurement object, which is supplied with a fixed measurement frequency by a frequency generator and supplied with a tuning voltage, where the tuning voltage can be changed in steps for obtaining an optimum tuning voltage.

2. Brief Description of the Background of the Invention Including Prior Art

The type of circuit to which the invention relates is useful in the balancing of high frequency circuits in communication receivers. Upon the reaching of an optimum tuning the change in the tuning voltage can be interrupted and the tuning voltage can be maintained constant.

For example, German Patent Application Laid Open DE-OS No. 2,854,852 teaches an automatic balancing unit for such apparatus, where the high frequency circuits are tuned to the desired receiver frequency with three auxiliary oscillators and with analog storage elements coordinated to the auxiliary oscillators and with the employment of a phase locked loop. In this circuit, the tuner oscillator is also employed for the balancing. In addition, auxiliary oscillators are required corresponding to the number of the high frequency circuits to be tuned. The number of the required auxiliary oscillators and thus the material expenditures is increased in a particular way if for example during the tuning of a television receiver band I, band III and the bands IV and V are to be tuned. Here the danger exists of ambiguities between the frequencies of the tuner oscillator, of the auxiliary oscillators and of the received frequencies. It is disadvantageous for a practical realization of the reference tuning unit that the exciting windings of the auxiliary oscillators can generate undesired resonances and damping of the circuits with the individual coils in the high frequency circuits, which in addition can cause an uncontrolled detuning of the circuits, if the auxiliary oscillators are switched off after the tuning is performed.

SUMMARY OF THE INVENTION

1. Purposes of the Invention

It is an object of the present invention to provide a circuit for determination of optimum tuning of filters, which is very cost effective.

It is a further object of the invention to provide a circuit for filter tuning, which is relatively simple, which does not require a plurality of oscillators and which is well suited for integrated circuit technology.

It is another object of the invention to provide a tuning circuit, which is substantially independent of the size of the output signal of the filter employed.

These and other objects and advantages of the present invention will become evident from the description which follows.

2. Brief Description of the Invention

The present invention provides a circuit for measuring and recognizing of a maximum output voltage at an electronic filter. A generator provides a fixed measurement frequency. A control unit furnishes a stepwise adjustable control voltage. An electronic filter circuit is fed with the fixed measurement frequency from the generator and comprises a tuning diode and receives the stepwise adjustable control voltage. A direct current rectifier-amplifier is connected to the output of the electronic filter circuit for rectifying and amplifying the output measurement voltage of the electronic filter circuit. A clocked switch has its input connected to the output of the rectifier-amplifier and has two outputs. An analog intermediate storage is connected to one output of the clocked switch for storing the voltage value at the respective output of the clocked switch. An intermediate switch is clocked by the control unit and is connected to the output of the analog intermediate storage. A stop pulse control and generation stage is connected to the output to the intermediate switch for providing a pulse upon the reaching of a maximum value of the measurement voltage and connected to the control unit for transmitting the pulse to the control unit such that the control unit interrupts a further change of the tuning voltage for the electronic filter.

The stop pulse generator stage can be provided with two inputs, which are connected to an output each of the intermediate switch. The intermediate switch can be connected such that the last measurement value in each case fed from a storage element passes in each case to the same input of the stop pulse generator stage. The direct voltage rectifier-amplifier can be controlled such in its amplification depending on the voltage at the output of the intermediate storage that the amplification is large at small incoming voltages and vice versa. A control stage can be connected to the output of the intermediate switch and can have its output connected to the rectifier-amplifier for controlling the amplification such that the output becomes independent of the electronic filter circuit output voltage. A digital to analog converter is preferably connected to the control unit and to a tuning diode of the electronic filter circuit. A phase locked loop can be connected to and controlled by the control unit for the generator to provide a fixed frequency. The control unit preferably is an integrated circuit. Preferably, a second analog intermediate storage is connected to the second output of the clocked switch and to the intermediate switch.

There is also provided a method for measuring and recognizing of a maximum output voltage at an electronic filter. A controlled frequency is fed to an electronic filter. The filtering properties are controlled with a tuning voltage signal from a control unit, which is applied to a tuning diode of the filter. The output of the filter is rectified in a rectifier. The output of the rectifier is amplified in an amplifier. The amplified signal is transmitted to a switch. The switch is clocked with a clock signal generated by a control unit such that the output signal of the switch is provided at one of two outputs depending on the clock cycle. The output signals of the switch are stored in a respective analog intermediate storage. The output signal of the analog intermediate storage is fed to respective inputs of an intermediate switch. The intermediate switch is clocked with a clock signal generated by the control unit. The output of the intermediate switch is fed to a stop pulse generator and control stage. A pulse generator and is emitted by the stop pulse control stage when the output of the intermediate switch indicates a maximum. The pulse is fed to the control unit. The change in the tuning voltage signal supplied to the electronic filter is interrupted upon receipt of the pulse in the control unit.

An integrated circuit can be employed as a control unit. The tuning voltage signal supplied by the integrated circuit can be converted in a digital to analog converter. The output of the digital to analog converter can be applied to the tuning diode. An output signal of the intermediate switch is preferably fed back to the amplifier for providing a large amplification in case of small filter output voltages and a small amplification in case of large filter output voltages. A frequency depending on a signal from the integrated circuit can be phase locked for providing a controlled frequency.

The invention provides the advantage that the resolution is very high for the achieving of an exact maximum tuning and balancing and that the dynamic range of the tuning is much larger based on the possibility of feedback and this allows to process both large and small measurement voltages. This renders it unimportant in which voltage region the maximum is disposed which is to be tuned.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention:

FIG. 1 is a view of a schematic diagram of a circuit for determining the maximum output voltage of an electronic filter.

DESCRIPTION OF INVENTION AND PREFERRED EMBODIMENTS

In accordance with the present invention there is provided an electronic circuit for the measurement and the recognition of a maximum output voltage at a frequency selective electronic measurement object such as a filter. A fixed measurement frequency is fed from a generator to the measurement object. A control unit provides a stepwise variable control voltage for tuning of tuning diodes comprised in the measurement object. The measurement voltage output of the measurement object is rectified and amplified with a rectifier-amplifier. A switch 9 is clocked by the control unit 2 and the rectified measurement voltage is fed to the input of the switch 9. An analog intermediate storage 10, 11 is connected to each output of the switch 9 for storing of the voltage values disposed at the output of the switch 9. The two analog intermediate storage elements 10, 11 are connected in each case to the input of an intermediate switch 12, which is also clocked by the control unit 2. The outputs of the intermediate switch 12 are connected to a stop pulse control stage 13, which furnishes a pulse to the control unit 2 upon the reaching of a maximum value of the measurement voltage and the control unit interrupts a further change in the tuning voltage for the measurement object 1.

The stop pulse generator stage preferably is provided by a comparator circuit as indicated as a stop pulse generator stage 13 in the drawing.

The stop pulse generator stage 13 can have two inputs, each of which is connected to an output of the intermediate switch 12. The intermediate switch 12 is controlled such that in each case the last measurement value fed to the intermediate switch 12 from one of the storage elements 10, 11 in each case passes to the same input of the stop pulse generator 13. The direct voltage amplifier 8 amplifying the measurement voltage can be controlled in its amplification depending on the voltage present at the output of the measurement circuit such that the amplification is large in the case of small voltages and vice versa.

The filter circuit of a high frequency receiver apparatus is designated as 1, which is to be automatically tuned to an optimum value with the aid of the invention circuit. Initially an oscillator 3 is set to a fixed frequency via a control unit 2, where the filter 1 is to be optimally balanced for this frequency. The setting of the fixed frequency can for example be performed by adjusting of a phase-locked loop circuit 4 via a data line 5 connecting the phase-locked loop circuit to the control unit 2. The filter comprises a voltage controlled tuning diode for balancing and tuning, which diode 21 receives a tuning voltage from the control unit 2 via a digital-analog converter 6. After rectification of the measurement voltage with the aid of the rectifier 7 and after amplification with the amplifier 8 the signal is fed to the switch 9. The switch 9 is as desired switched with the aid of a clock cycle T furnished by the control unit 2. The measurement values are thereby applied to analog storage elements 10 and 11, which provide intermediate storing of the values. The storage elements 10, 11 are each connected to an input of the intermediate switch 12, the contacts of which are synchronously switched with the same cycle T as the switch 9. The measurement values pass from the intermediate switch 12 to a stop pulse generator connected as a differential amplifier or comparator circuit 13. The tuning voltage is changed by a digital step with each clock cycle T from the control unit 2. The in each case last measured voltage value passes to the same input of the differential amplifier 13. It is to be assumed that upon reaching of a maximum voltage value at the input of the differential amplifier 13 a positive pulse is to appear at the output. The actual measurement value in each case has to be applied to the inverted input of the differential amplifier. As soon as this actual measurement value begins to decrease based on the clocked stepping up of the tuning voltage at the filter 1, a positive pulse is generated at the output of the differential amplifier 13, which is applied to the input ST of the control unit 2. This pulse is processed such by the control unit 2 that a further change of the tuning is prevented. The value thus determined can be stored as an optimum tuning voltage. In case of receiver apparatus with several circuits the control unit 2 can provide the same adjustment process for the next filter, until the complete reception apparatus is optimally tuned.

Depending on the measurement values obtained, the degree of amplification of the direct voltage amplifier 8 can be changed with the aid of a control stage 14 such that the setup described becomes independent of the size of the measurement voltage. Thus a very sensitive evaluation is achieved in the area of the maximum of the measurement.

It will be understood that each of the elements described above, or two or more together, may also find a useful application in other types of tuning system configurations and signal processing procedures differing from the types described above.

While the invention has been illustrated and described as embodied in the context of an electronic circuit for the determination of extrema in an output voltage, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A circuit for measuring and recognizing of a maximum output voltage at an electronic filter comprising
   a generator for providing a fixed measurement frequency,
   a control unit providing a stepwise adjustable control voltage;
   an electronic filter circuit fed with the fixed measurement frequency from the generator where the electronic filter comprises a tuning diode, and receiving the stepwise adjustable control voltage; a direct current rectifier-amplifier connected to the output of the electronic filter circuit for rectifying and amplifying the output measurement voltage of the electronic filter circuit;
   a clocked switch having its input connected to the output of the rectifier-amplifier and said clocked switch having two outputs;
   an analog intermediate storage connected to one output of the clocked switch for storing the voltage value at the respective output of the clocked switch;
   an intermediate switch clocked by the control unit and connected to the output of the analog intermediate storage; and
   a stop pulse generator stage connected to the output of the intermediate switch for providing a pulse upon the reaching of a maximum value of the measurement voltage and connected to the control unit for transmitting the pulse to the control unit such that the control unit interrupts a further change of the tuning voltage for the electronic filter.

2. A circuit for measuring and recognizing of a maximum output voltage at an electronic filter according to claim 1 wherein the stop pulse generator stage is provided with two inputs, which are each connected to an output of the intermediate switch.

3. A circuit for measuring and recognizing of a maximum output voltage at an electronic filter according to claim 1 wherein the intermediate switch is connected such that the last measurement value in each case fed from a storage element passes in each case to the same input of the stop pulse generator stage.

4. A circuit for measuring and recognizing of a maximum output voltage at an electronic filter according to claim 1 wherein the direct voltage rectifier-amplifier is controlled such in its amplification depending on the voltage at the output of the intermediate storage that the amplification is large at small incoming voltages and vice versa.

5. A circuit for measuring and recognizing of a maximum output voltage at an electronic filter according to claim 4 further comprising
   a control stage connected to the output of the intermediate switch and having its output connected to the rectifier-amplifier for controlling the amplification such that the output becomes independent of the electronic filter circuit output voltage.

6. A circuit for measuring and recognizing of a maximum output voltage at an electronic filter according to claim 1 further comprising
   a digital to analog converter connected to the control unit and to a tuning diode of the electronic filter circuit.

7. A circuit for measuring and recognizing of a maximum output voltage at an electronic filter according to claim 1 further comprising
   a phase locked loop connected to and controlled by the control unit for the generator to provide a fixed frequency.

8. A circuit for measuring and recognizing of a maximum output voltage at an electronic filter according to claim 1 wherein the control unit is an integrated circuit.

9. A circuit for measuring and recognizing of a maximum output voltage at an electronic filter according to claim 1 further comprising a second analog intermediate storage connected to the second output of the clocked switch and to the intermediate switch.

10. A method for measuring and recognizing of a maximum output voltage at an electronic filter comprising
    feeding a controlled frequency to an electronic filter;
    controlling the filtering properties with a tuning voltage signal form a control unit, which is applied to a tuning diode of the filter;
    rectifying the output of the filter in a rectifier;
    amplifying the output of the rectifier in an amplifier;
    transmitting the amplified signal to a switch;
    clocking the switch with a clock signal generated by a control unit such that the output signal of the switch is provided at one of two outputs depending on the clock cycle; storing the output signals of the switch in a respective analog intermediate storage;
    feeding the output signal of the analog intermediate storage to respective inputs of an intermediate switch;
    clocking the intermediate switch with a clock signal generated by the control unit;
    feeding the output of the intermediate switch to a stop pulse generator stage;
    emitting a pulse from the stop pulse generator stage when the output of the intermediate switch indicates a maximum; feeding the pulse to the control unit; and interrupting the change in the tuning voltage signal supplied to the electronic filter upon receipt of the pulse in the control unit.

11. A method for measuring and recognizing of a maximum output voltage at an electronic filter according to claim 10 further comprising
    employing an integrated circuit as a control unit.

12. A method for measuring and recognizing of a maximum output voltage at an electronic filter according to claim 11 further comprising
    converting the tuning voltage signal supplied by the integrated circuit in a digital to analog converter;
    applying the output of the digital to analog converter to the tuning diode.

13. A method for measuring and recognizing of a maximum output voltage at an electronic filter according to claim 11 further comprising feeding an output signal of the intermediate switch back to the amplifier for providing a large amplification in case of small filter output voltages and a small amplification in case of large filter output voltages.

14. A method for measuring and recognizing of a maximum output voltage at an electronic filter according to claim 11 further comprising phase locking a frequency depending on a signal from the integrated circuit for providing a controlled frequency.

15. The circuit for measuring and recognizing of a maximum output voltage at an electronic filter according to claim 1 wherein the electronic filter circuit fed with the fixed measurement frequency from the generator comprises a tuning diode.

* * * * *